US010374614B2

(12) United States Patent
Schrom et al.

(10) Patent No.: US 10,374,614 B2
(45) Date of Patent: Aug. 6, 2019

(54) PHASE AND FREQUENCY DIGITAL SYNCHRONIZER

(71) Applicant: Intel Corporation, Santa Clara, CA (US)

(72) Inventors: Gerhard Schrom, Hillsboro, OR (US); Sarath Makala, Hillsboro, OR (US); Kowshik Gandham, Alviso, CA (US); Chun Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/854,624

(22) Filed: Dec. 26, 2017

(65) Prior Publication Data

US 2019/0199358 A1    Jun. 27, 2019

(51) Int. Cl.
*G06F 1/12*     (2006.01)
*H03L 7/00*     (2006.01)
*H03L 7/085*    (2006.01)
*H03L 7/099*    (2006.01)

(52) U.S. Cl.
CPC .................. *H03L 7/00* (2013.01); *G06F 1/12* (2013.01); *H03L 7/085* (2013.01); *H03L 7/0991* (2013.01)

(58) Field of Classification Search
CPC ...... G06F 1/12; H03L 7/00; H03L 7/06; H03L 7/08; H03L 7/085; H03L 7/0991; H03L 7/0992; H03L 7/0994
USPC .................. 327/141, 155, 156, 159, 160
See application file for complete search history.

(56) References Cited

U.S. PATENT DOCUMENTS 5,381,116 A * 1/1995 Nuckolls .................. H03L 7/08
                                                    327/159

* cited by examiner

*Primary Examiner* — William Hernandez
(74) *Attorney, Agent, or Firm* — Schwegman Lundberg & Woessner, P.A.

(57) ABSTRACT

Some embodiments include apparatuses and methods using the apparatuses. Some of the apparatuses include a phase frequency detector to generate output information having a value based on a relationship between a first clock signal and a second clock signal, a memory element to store the values of the output information, a digital control oscillator to generate the second clock signal having a phase and frequency based on a digital code, the digital code having a value based on control information, and circuitry to generate the control information based on conditions determined at least from the values stored in the memory element.

19 Claims, 5 Drawing Sheets

PHASE AND FREQUENCY DIGITAL SYNCHRONIZER

TECHNICAL FIELD

Embodiments described herein pertain to power management in electronic devices and systems. Some embodiments relate to voltage controllers in integrated circuit devices.

BACKGROUND

Voltage controllers are included in many electronic devices (e.g., semiconductor chips) to control voltages used by components in these devices. Some components of conventional voltage controllers can be implemented in analog or digital form. Analog implementation often consumes a relatively large device area. Digital implementation is usually complex. Thus, voltage controllers having such components are unsuitable for devices that have limited device area and devices adopted to operate with less complex circuitry.

DETAILED DESCRIPTION

The techniques described herein relate to voltage controllers having a synchronizer component that has a relatively small device area and less complex circuitry in comparison to some conventional voltage controllers. Other improvements and benefits of the technique described herein are discussed below with reference to FIG. 1 through FIG. 6.

Figure 1:
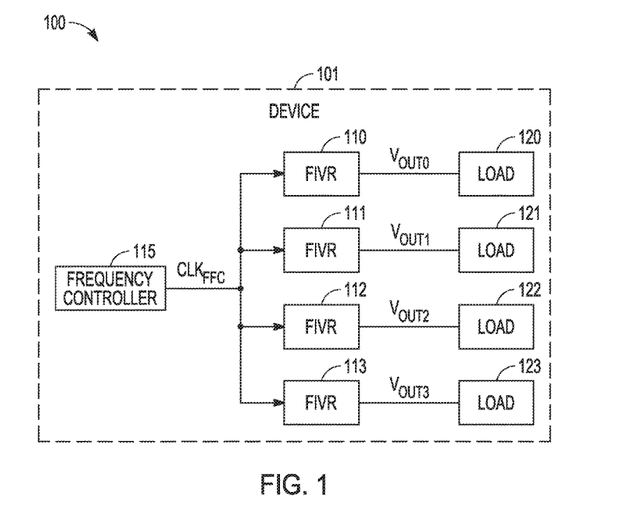
FIG. 1 shows an apparatus including fully integrated voltage regulars (FIVRs), according to some embodiments described herein.

FIG. 1 shows an apparatus 100 including FIVRs 110, 111, 112, and 113, according to some embodiments described herein. Apparatus can include or can be included in a system-on-chip (SoC), a computer (e.g., desktop or laptop), a tablet, a mobile device (e.g., a smartphone), and other electronic devices and systems.

As shown in FIG. 1, apparatus 100 can include a device 101, which can include an integrated circuit (IC) device (e.g., an IC chip). Examples of device 101 include a microprocessor, an application-specific integrated circuit (ASIC), a graphics processor, or other devices.

As shown in FIG. 1, FIVRs 110, 111, 112, and 113 can be located in (e.g., formed in or formed on) device 101. For example, device 101 can include a substrate (e.g., a semiconductor (e.g., silicon) substrate) and FIVRs 110, 111, 112, and 113 can be formed in (or formed on) the substrate of device 101. Device 101 can also include a frequency controller 115 and loads 120, 121, 122, and 123 located in (e.g., formed in or formed on) the substrate of device 101. Loads 120, 121, 122, and 123 can include function units (e.g., circuitry) of device 101.

FIVRs 110, 111, 112, and 113 can provide voltages (e.g., regulated voltages) $V_{OUT0}$, $V_{OUT1}$, $V_{OUT2}$, and $V_{OUT3}$, respectively. Loads 120, 121, 122, and 123 can use $V_{OUT0}$, $V_{OUT1}$, $V_{OUT2}$, and $V_{OUT3}$, respectively, as supply voltages. Frequency controller 115 can provide a clock signal $CLK_{FFC}$ (e.g., a reference clock signal). FIVRs 110, 111, 112, and 113 can use clock signal $CLK_{FFC}$ in as part of their operations (e.g., as a reference clock signal) to control (e.g., regulate) the values of voltage $V_{OUT0}$, $V_{OUT1}$, $V_{OUT2}$, and $V_{OUT3}$, respectively.

Figure 2:
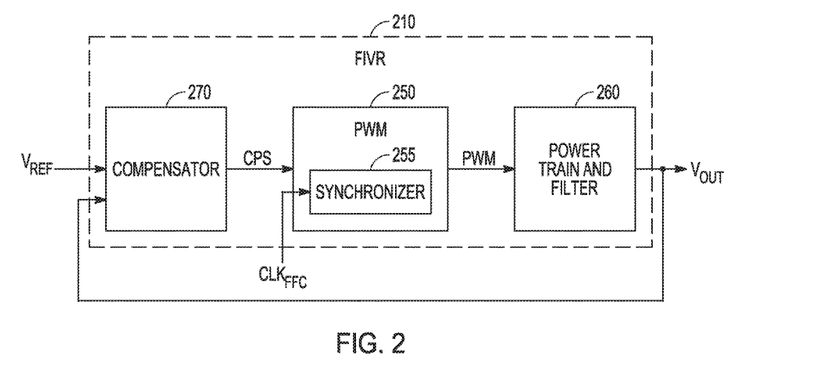
FIG. 2 shows an FIVR including a pulse-width modulator (PWM), according to some embodiments described herein.

FIG. 2 shows an FIVR 210 including a PWM 250, according to some embodiments described herein. FIVR 210 can be one of FIVRs 110, 111, 112, and 113 of FIG. 1. As shown in FIG. 2, FIVR 210 can provide a voltage $V_{OUT}$, which can correspond to one of voltages $V_{OUT0}$, $V_{OUT1}$, $V_{OUT2}$, and $V_{OUT3}$ of FIG. 1.

As shown in FIG. 2, FIVR 210 can include power train and filter circuit 260 to provide voltage $V_{OUT}$. PWM 250 can operate to generate a signal PWM (PWM output signal). Power train and filter circuit 260 can use signal PWM to control the value of voltage $V_{OUT}$. FIVR 210 can include a compensator 270 that can operate to generate a signal CPS based on voltage $V_{OUT}$ and a reference voltage $V_{REF}$. PWM 250 can use signal CPS to control (e.g., control the phase and frequency) signal PWM. PWM 250 can include a synchronizer 255 that can operate to assist PWM 250 to control signal PWM based on clock signal $CLK_{FFC}$.

Figure 3:
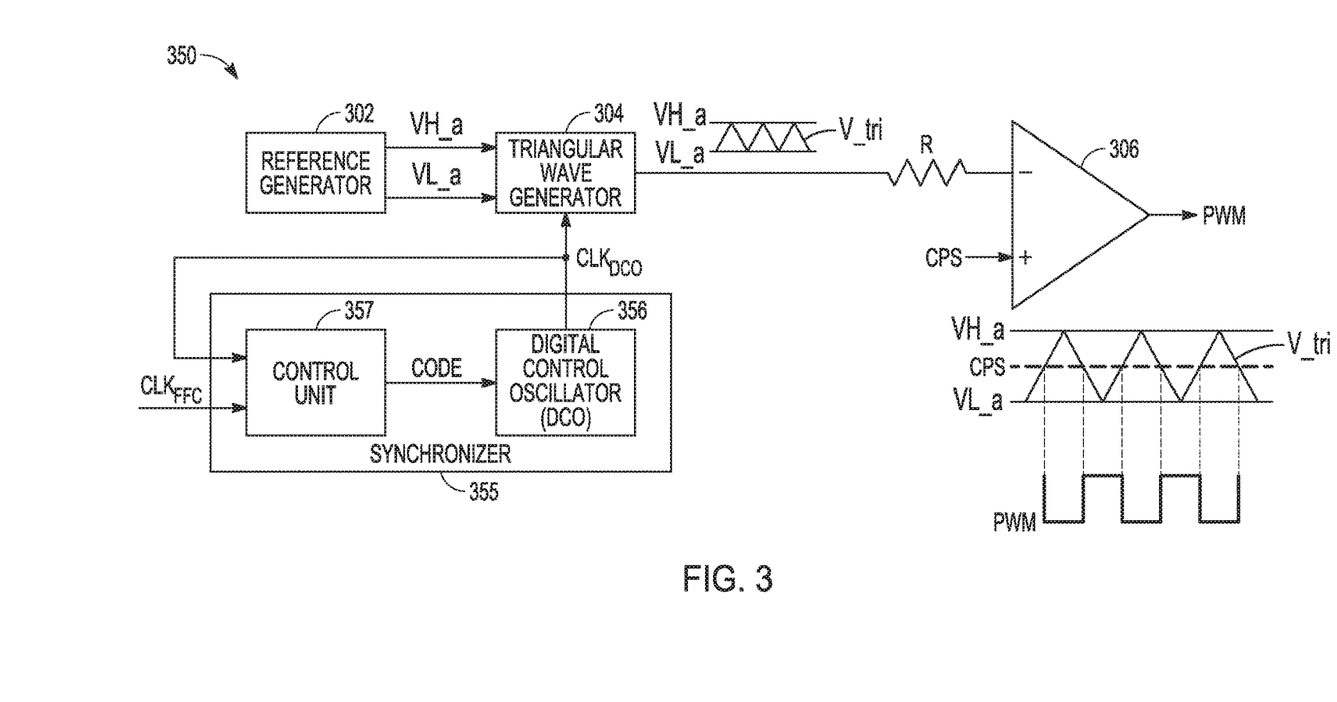
FIG. 3 shows a PWM including a synchronizer, according to some embodiments described herein.

FIG. 3 shows a PWM 350 including a synchronizer 355, according to some embodiments described herein. PWM 350 can correspond to PWM 250 of FIG. 2. As shown in FIG. 3, PWM 350 can include a voltage reference generator 302 that can operate to generate voltages VL_a and VH_a, a triangular wave generator 304 that can operate to generate a signal (triangular wave signal) V_tri. As shown in FIG. 3, the waveform of signal V_tri can have a range (e.g., lower and upper voltage values) based on voltages VL_a and VH_a. PWM 350 can include a comparator 306 that can operate to receive signal V_tri (through a resistor R) and signal CPS (which can correspond to signal CPS of FIG. 2). Comparator 306 can operate to generate signal PWM based on the comparison between signals V_tri and CPS. The relationship (e.g., waveforms) among signals V_tri, CPS, and PWM is shown in FIG. 3.

Synchronizer 355 can operate to generate a clock signal (e.g., an oscillating output clock signal) $CLK_{DCO}$, which is used by triangular wave generator 304 for the generation of signal V_tri. As shown in FIG. 3, synchronizer 355 can include a digital control oscillator (DCO) 356 that can operate to generate clock signal $CLK_{DCO}$. The phase and frequency of signal $CLK_{DCO}$ can be controlled (e.g., adjusted) by information CODE (e.g., a digital code). Information CODE can include a number of bits. The phase and frequency of signal $CLK_{DCO}$ can be controlled by changing the value of information CODE. Synchronizer 355 can include a control unit (e.g., control circuitry) 357 that can operate to control (e.g., adjust) the value of information CODE based on the relationship (e.g., phase and frequency) between clock signal $CLK_{DCO}$ and clock signal $CLK_{KFC}$ (which can correspond to clock signal $CLK_{KFC}$ of FIG. 1). Synchronizer 355 can include the synchronizer described below with reference to FIG. 4.

Figure 4:
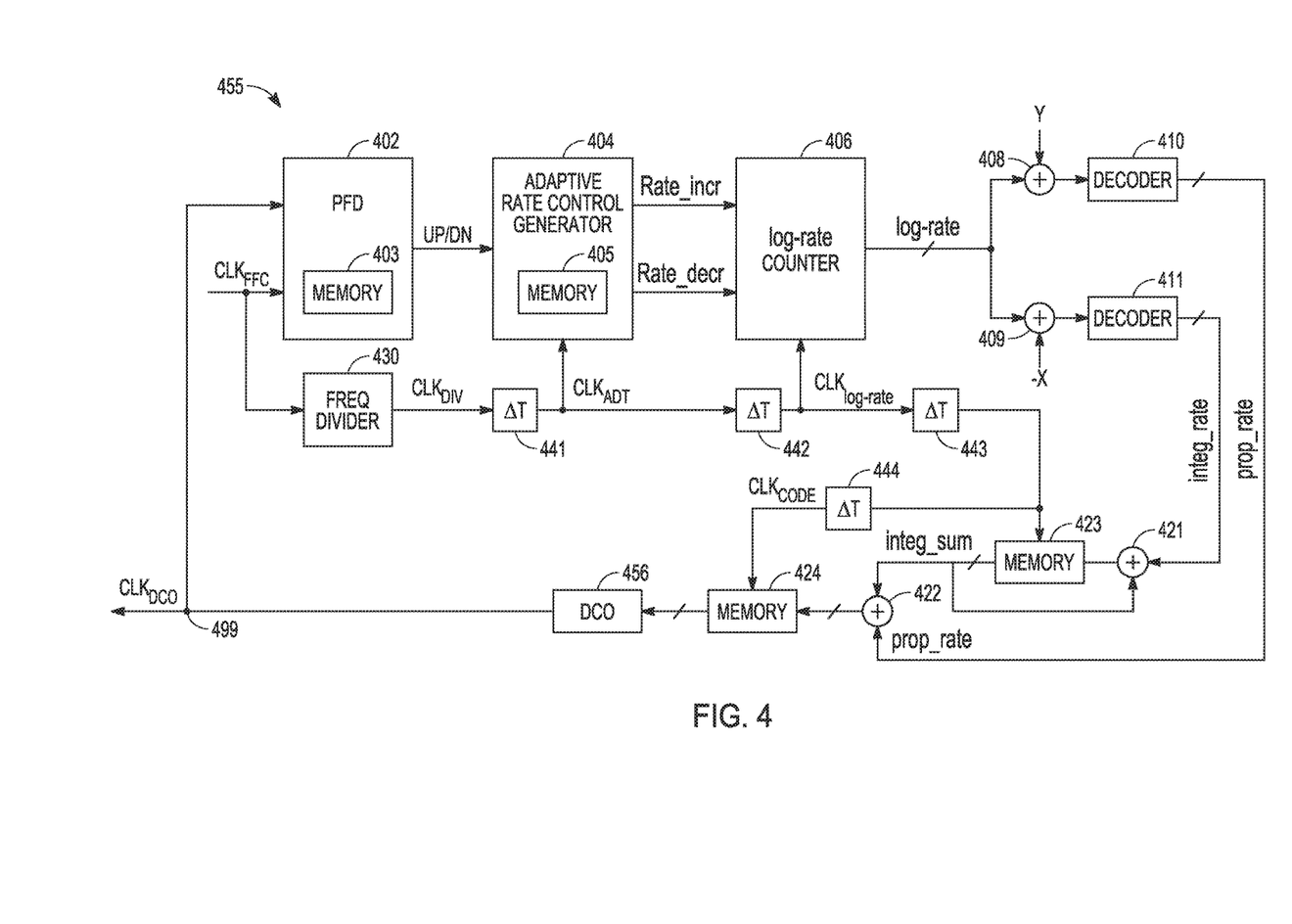
FIG. 4 shows a synchronizer, according to some embodiments described herein.

FIG. 4 shows a synchronizer 455, according to some embodiments described herein. Synchronizer 455 can be used as synchronizer 355 of FIG. 3. As shown in FIG. 4, synchronizer 455 can include a DCO 456 that can operate to generate clock signal $CLK_{DCO}$. Synchronizer 455 can generate information CODE the control (e.g., adjust) the phase and frequency of signal $CLK_{DCO}$. Information CODE can include a number of bits (e.g., 10 bits). The phase and frequency of signal $CLK_{DCO}$ can be controlled by changing the value of information CODE. Synchronizer 455 can operate to control (e.g., adjust) the value of information CODE, such that the phase and frequency of clock signal $CLK_{DCO}$ can be locked to those of clock signal (e.g., reference clock signal) $CLK_{FFC}$. Clock signal $CLK_{FFC}$ can correspond to clock signal $CLK_{FFC}$ of FIG. 1.

As shown in FIG. 4, synchronizer 455 can include a phase and frequency detector (PFD) 402 that can operate to compare clock signal $CLK_{FFC}$ with clock signal $CLK_{DCO}$, which is fed back from node 499 to PFD 402. Based on the comparison, PFD 402 can generate an error signal at an output (e.g., output node) of PFD 402 in the form of information UP/DN (up or down). Information UP/DN at the output of PFD 402 can also referred to as PFD output (PFD output information). Information UP/DN can be digital information, which can include a bit (e.g., only a single bit).

The value of information UP/DN can indicate a relationship (e.g., phase or frequency relationship) between clock signals $CLK_{DCO}$ and $CLK_{FFC}$. For example, if information UP/DN has one value (e.g., "UP" value, such as a value of binary 1 ("1")), then it can indicate that clock signal $CLK_{DCO}$ is lagging in phase or frequency relative to that clock signal $CLK_{FFC}$. In another example, if information UP/DN has another value (e.g., "DN" value, such as value of binary 0 ("0")), then it can indicate that clock signal $CLK_{DCO}$ is leading in phase or frequency relative to that clock signal $CLK_{FFC}$. PFD 402 can include a memory circuit (e.g., a register or latch) 403 that can store the value of information UP/DN until a new value of information UP/DN is generated (e.g., generated based on a new comparison between signals $CLK_{DCO}$ and $CLK_{FFC}$).

Each value of information UP/DN can be based on (e.g., generated from) a relationship between the between signals $CLK_{DCO}$ and $CLK_{FFC}$ (e.g., generated based on whether a rising edge of clock signal $CLK_{DCO}$ is lagging (or leading) a rising edge of clock signal $CLK_{FFC}$). Different values of information UP/DN can be based on (e.g., generated from) different relationships between the between signals $CLK_{DCO}$ and $CLK_{FFC}$. The different relationships can be determined by comparing (e.g., comparing the edges of) clock signal $CLK_{DCO}$ and $CLK_{FFC}$) at different times where information CODE can have a different value during each comparison.

Synchronizer 455 can include an adaptive update-rate control generator 404, which can operate to store current and previous values of information UP/DN. Adaptive update-rate control generator 404 can adjust (e.g., increase or decrease) a rate based on certain conditions (e.g., predetermined conditions), as discussed below.

For example, adaptive update-rate control generator 404 can generate an increase log-rate information (e.g., rate control information) Rate_incr if the following condition is met ("N is an integer):

N consecutive "UP" value (e.g., information UP/DN="1"; "1"; "1"; "1" where N=4 in this example), or N consecutive "DN" value (e.g., information UP/DN="0"; "0"; "0"; "0" where N=4).

If either of the above conditions (N consecutive of either "UP" or "DN") is met, increase log-rate information Rate_incr can be set to 1.

In another example, adaptive update-rate control generator 404 can generate a decrease log-rate information (e.g., rate control information) Rate_decr if the following condition is met ("M is an integer):

M consecutive "UP followed by DN" values (e.g., information UP/DN="1", "0"; "1", "0"; "1", "O" where M=3 in this example), or M consecutive "DN followed by UP" values (e.g., information UP/DN="0", "1"; "0", "1"; "0", "1" where M=3 in this example), The value of N and M are programmable and are used for faster lock times, periodic jitter reduction, and stability improvement.

If either of the conditions (M consecutive of either "UP followed by DN" or "DN followed by UP") is met, decrease log-rate information Rate_incr set to 1.

Adaptive update-rate control generator 404 can include a memory element (e.g., register) 405 to store a number of values (a current value and previous values of information UP/DN) that are used in determine whether the conditions described above are met. For example, adaptive update-rate control generator 404 can store a number of "UP" values (a current value and previous values) and a number of "DN" values (a current value and previous values), such that the conditions described above (N consecutive "UP" value, N consecutive "DN" value M consecutive "UP followed by DN", or M consecutive "DN followed by UP") can be correctly determined.

Synchronizer 455 can include a log-rate counter 406 that can generate information (correction information) log-rate, which has a value based on increase and decrease log-rate information (Rate_incr and Rate_decr). Information log-rate (e.g., correction information) can include at least one bit (one bit or multiple bits) having a value indicating a correction amount to correct the error between clock signals $CLK_{DCO}$ and $CLK_{FFC}$. The value of information log-rate can be updated (e.g., increase, decrease, or remain the same (remain at a current value) based on the values of increase and decrease log-rate information (Rate_incr and Rate_decr).

Synchronizer 455 can include a circuit portion (e.g., circuitry) that includes adders 408 and 409, and decoders 410 and 411 to generate information prop_rate (proportional rate control information) and information integ_rate (integral rate control information). Each of information prop_rate and integ_rate can include a number of bits. Information prop_rate and integ_rate can have the same number of bits (e.g., 10 bits).

As shown in FIG. 4, decoder 410 can generate information prop_rate based on the value (e.g., updated value) of log-rate and the value of parameter Y, such that prop_rate=2^(log-rate+Y). Decoder 411 can generate information integrate based on the value (e.g., updated value) of log-rate and the value of parameter X, such that prop_rate=2^ (log-rate−X).

Parameters X and Y can be programmable with values that are selected to trade-off between better system stability and faster lock times.

Synchronizer 455 can include a circuit portion (e.g., circuitry) that includes adders 421 and 422, and memory elements (e.g., a register or latch) 423 and 424 to generate information integ_sum. Information integ_sum can include a number of bits (e.g., 10 bits). Synchronizer 455 can generate information CODE based on the value of information UP/DN, integ_sum, and prop_rate.

The value of integ_sum can be based on the value of information integ_rate and the value of information UP/DN (generated by PFD 402).

For example, integ_sum=integ_sum+integrate if information UP/DN has an "UP" value (e.g., information UP/DN="1").

In another example, integ_sum=integ_sum−integ_rate if information UP/DN has a "DN" value (e.g., information UP/DN="0").

The value of information CODE can be calculated as follows.

CODE=integ_sum+prop_rate if information UP/DN has an "UP" value.

CODE=integ_sum−prop_rate if information UP/DN has a "DN" value.

The frequency and phase of clock signal $CLK_{DCO}$ can be changed (e.g., updated) by changing the value information CODE. For example, synchronizer 455 can increase the value of value information CODE if clock signal $CLK_{DCO}$ is lagging in phase or frequency relative to that clock signal $CLK_{FFC}$. In another example, synchronizer 455 can decrease the value of value information CODE if clock signal $CLK_{DCO}$ is leading in phase or frequency relative to that clock signal $CLK_{FFC}$.

Synchronizer 455 can repeat the operation cycle (e.g., repeat the generation of information UD/DN, log-rate, prop_rate, integ_rate, and CODE) to update the value of information CODE until a lock in phase and frequency between clock signals $CLK_{DCO}$ and $CLK_{FFC}$ is achieved.

In synchronizer 455, maximum values of information log-rate, prop_rate can be programmable. To prevent digital code overflow above the maximum value allowed, limits (e.g., upper limits) can be applied to information log-rate, prop_rate, integ_rate, and CODE. To prevent negative values, lower limits can be constrained to zero.

As shown in FIG. 4, synchronizer 455 can include a frequency divider 430 that can operate to divide the frequency of clock signal $CLK_{FFC}$ and generate a clock signal $CLK_{DIV}$. Frequency divider 430 can be a programmable frequency divider, such that the frequency of clock signal $CLK_{DIV}$ can be selected to be a fraction of the frequency of clock signal $CLK_{FFC}$.

Synchronizer 455 can include delay stages 441, 442, 443, and 444, each of which can delay a signal by a time delay (indicated by ΔT (delta T)). As shown in FIG. 4, synchronizer 455 can generate clock signals (multi-phase clock) $CLK_{ADT}$, $CLK_{log\text{-}rate}$, $CLK_{integ}$, and $CLK_{CODE}$ based on clock signal $CLK_{DIV}$ (which is generated based on $CLK_{FFC}$). Synchronizer 455 can use clock signals $CLK_{ADT}$, $CLK_{log\text{-}rate}$, $CLK_{integ}$, and $CLK_{CODE}$ as timing signals to control operations of adaptive rate control generator 404, log-rate counter 406, memory 423, and memory 424, respectively. Delay stages 441, 442, 443, and 444 can be programmable delay stages, such that the time delay applied to a signal (e.g., clock signal) by each delay stage can be selected (e.g., programmed).

The inclusion of frequency divider 430 and stages 441, 442, 443, and 444 in synchronizer 455 allows the techniques described herein to improve (e.g., shorten) the computation of stages in the loop and maintain loop stability, as discussed in more detail below (after the description of FIG. 5).

Figure 5:
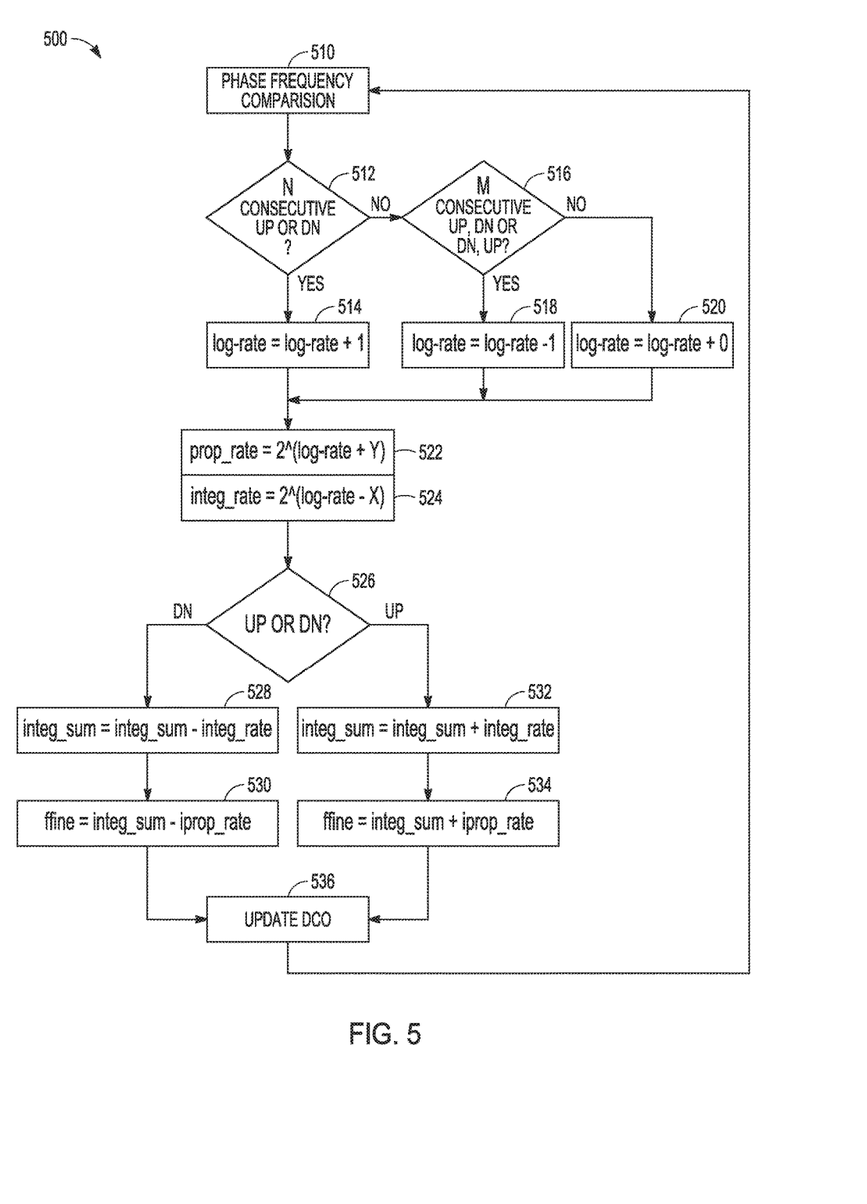
FIG. 5 is a flowchart showing a method of operating an apparatus, according to some embodiments described herein.

FIG. 5 is a flowchart showing a method 500 of operating an apparatus, according to some embodiments described herein. The apparatus used in method 500 can include any of the apparatuses (e.g., apparatus 100, FIVR 210, PWM 350, synchronizer 455, and system 600 (FIG. 6)) described above with reference to FIG. 1 through FIG. 4. Some of the activities in method 500 may be performed by hardware, software, firmware, or any combination of hardware, software, and firmware. For example, some of the activities in method 500 may be performed by hardware, software, firmware, or any combination of hardware, software, and firmware implemented in any of the apparatus (e.g., apparatus 100, FIVR 210, PWM 350, synchronizer 455, and system 600 (FIG. 6)) described above with reference to FIG. 1 through FIG. 5.

The following description refers to FIG. 4 and FIG. 5. As shown in FIG. 5, method 500 can include activity 510, which can include determining the relationship between clock signals $CLK_{DCO}$ and $CLK_{FFC}$ (FIG. 4). For example, activity 510 can include determining whether an edge (e.g., rising edge) of signal $CLK_{DCO}$ is lagging or leading an edge (e.g., rising edge) of signal $CLK_{FFC}$. Activity 510 can generate information UP/DN, which has a value (e.g., "UP" or "DN") based on the relationship between clock signals $CLK_{DCO}$ and $CLK_{FFC}$.

Activity 512 can include checking the condition of whether N consecutive "UP" value or N consecutive "DN" is met. If the condition is met, method 500 can continue with activity 514, which can include calculating the value for information log-rate. For example, log-rate=log-rate+1, which means activity 514 increases the value of information log-rate.

Method 500 can include activity 516 if the condition in activity 512 is not met. Activity 516 can include checking the condition of whether M consecutive "UP followed by DN" values or M consecutive "DN followed by UP" values is met. If the condition is met, method 500 can continue with activity 518, which can include calculating the value for information log-rate. For example, log-rate=log-rate−1, which means activity 518 decreases the value of information log-rate.

Method 500 can include activity 520 if the condition in activity 516 is not met. Activity 520 can include calculating the value for information log-rate. For example, log-rate=log-rate+0, which means activity 520 keeps the value of information log-rate unchanged.

Method 500 can include activity 522, which can include calculating the value for information prop_rate. For example, prop_rate=2^(log-rate+Y).

Method 500 can include activity 524, which can include calculating the value for information integ_rate. For example, integ_rate=2^(log-rate−X).

Method 500 can include activity 526, which can include checking for the value (current value) of information UP/DN to calculate the values for information integ_sum and information CODE.

Method 500 can include activities 528 and 530 if information UP/DN has a "DN" value, and activities 532 and 534 if information UP/DN has an "UP" value.

Activity 528 can include calculating the value for information integ_sum. For example, integ_sum=integ_sum−integ_rate.

Activity 530 can include calculating the value for information CODE. For example, CODE=integ_sum−prop_rate.

Activity 532 can include calculating the value for information integ_sum. For example, integ_sum=integ_sum+integ_rate.

Activity 534 can include calculating the value for information CODE. For example, CODE=integ_sum+prop_rate.

Method 500 can include activity 536, which can include updating the value of information CODE based on the value of value of information CODE calculated in activity 530 or 534.

Method 500 can include the repeat activities 510 through activity 536 until a lock in phase and frequency between clock signals $CLK_{DCO}$ and $CLK_{FFC}$ is achieved.

Method 500 can include fewer or more activities relative to activities 510 through 536 shown in FIG. 5. For example, method 500 can include activities and operations of apparatus 100, FIVR 210, PWM 350, and synchronizer 455 described above with reference to FIG. 1 through FIG. 5.

The techniques described above with reference to FIG. 4 and FIG. 5 regarding synchronizer 455 have improvements and benefits over some conventional techniques. For example, as described above, the synchronizer adaptive update-rate control technique (e.g., performed by adaptive update-rate control generator 404) that increases or decreases information log-rate based on current and previous PFD outputs (information UP/DN). Information log-rate (which controls amount of correction) can be adaptively adjusted in response to PFD output error between clock signals $CLK_{FFC}$ and $CLK_{DCO}$ from the current and previous clock cycles. Incrementing the value of information log-rate helps to speed up the phase and frequency locking time. Decrementing the value of information log-rate helps in stabilizing the feedback loop and reducing the amount of cycle to cycle jitter.

In the techniques described herein (e.g., in synchronizer 455), computations of stages involved in the loop can be completed in a relatively shorter time (e.g., in one cycle or less (single-cycle multi-phase clock)) than some conventional techniques and still provide loop stability and faster lock time (as mentioned above in the description of FIG. 4). For example, as shown in FIG. 4, shorter completion of the computations can be achieved by using programmable delay stages 441, 442, 443, and 444 to delay the clock signal (e.g., $CLK_{ADT}$, $CLK_{log-rate}$, $CLK_{integ}$, or $CLK_{CODE}$) for each stage so as to allow enough time to complete computations of that respective stage and avoid potential setup and hold time violations. This technique helps to complete loop computations in a relatively short time (e.g., in one clock cycle). Further, programmable clock frequency divider 430 can be used to choose a divided clock (e.g., $CLK_{DIV}$) to time digital logic in situations where more time is needed to complete computations. This helps completing computations in a relatively short time (e.g., in one clock cycle) without causing potential cycle skipping and loss of data.

Further, unlike some conventional techniques where PFD output is reset after error information is computed, the techniques described herein store the value of PFD output (e.g., store the value of information UP/DN in memory element 403). The stored value is used as in a portion (e.g., in a later stage) of the algorithm implementation (e.g., method 500). Depending on the value (e.g., "UP" value or "DN" value) of information UP/DN, the values of information inter_sum and information CODE can be calculated accordingly.

Moreover, log-rate, proportional control (P) rate (e.g., prop_rate), and integral control (I) rate (e.g., integ_rate) implementation based on the techniques described herein can further allow synchronizer 455 to have a relatively reduced area. For example, the value of information log-rate, prop_rate, integ_rate can be computed first with K bits (K is an integer) and then decoded as 2^K bits before DCO control code (e.g., information CODE) computation. This computation technique can save area for synchronizer 455 in comparison with some conventional techniques. For example, some conventional techniques may first decode into 2^K bits and then compute other information (e.g., proportional control rate and integral control rate). Such conventional techniques may need a relatively large device area for registers (to save bits) and computation computational hardware associated with the computation.

Figure 6:
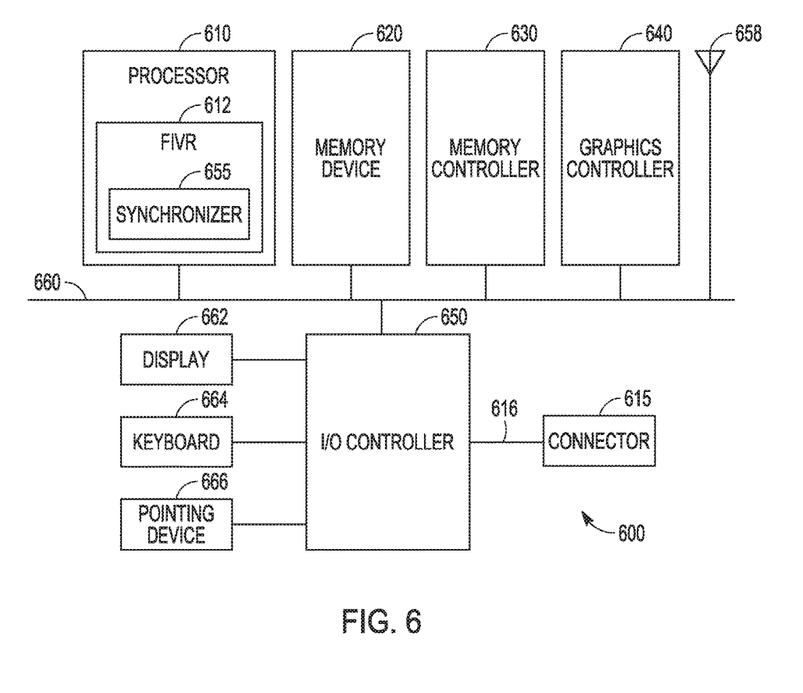
FIG. 6 shows an apparatus in the form of a system (e.g., electronic system), according to some embodiments described herein.

FIG. 6 shows an apparatus in the form of a system (e.g., electronic system) 600, according to some embodiments described herein. System 600 can include or be included in a computer, a tablet, a mobile device, or other electronic systems. As shown in FIG. 6, system 600 can include a processor 610, a memory device 620, a memory controller 630, a graphics controller 640, an input/output (I/O) controller 650, a display 662, a keyboard 664, a pointing device 666, at least one antenna 658, a connector 615, and a bus 660 (e.g., conductive lines formed on a circuit board (not shown) of system 600).

Each of processor 610, memory device 620, memory controller 630, graphics controller 640, and I/O controller 650 can include an IC chip (e.g., IC device).

In some arrangements, system 600 does not have to include a display. Thus, display 662 can be omitted from system 600. In some arrangements, system 600 does not have to include any antenna. Thus, antenna 658 can be omitted from system 600.

Processor 610 can include a general-purpose processor or an application specific integrated circuit (ASIC). Processor 610 can include a central processing unit (CPU).

Memory device 620 can include a dynamic random access memory (DRAM) device, a static random access memory (SRAM) device, a flash memory device, phase change memory, a combination of these memory devices, or other types of memory. FIG. 6 shows an example where memory device 620 is a stand-alone memory device separated from processor 610. In an alternative arrangement, memory device 620 and processor 610 can be located on the same die. In such an alternative arrangement, memory device 620 is an embedded memory in processor 610, such as embedded DRAM (eDRAM), embedded SRAM (eSRAM), embedded flash memory, or another type of embedded memory.

Display 662 can include a liquid crystal display (LCD), a touchscreen (e.g., capacitive or resistive touchscreen), or another type of display. Pointing device 666 can include a mouse, a stylus, or another type of pointing device.

I/O controller 650 can include a communication module for wired or wireless communication (e.g., communication through one or more antennas 658). Such wireless communication may include communication in accordance with WiFi communication technique, Long Term Evolution Advanced (LTE-A) communication technique, or other communication techniques.

I/O controller 650 can also include a module to allow system 600 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, MIPI standard, and other specifications.

Connector 615 may be coupled to I/O controller 650 through a connection 616 (e.g., a bus). Connector 615 can be arranged (e.g., can include terminals, such as pins or pads) to allow system 600 to be coupled to an external device (or system). Such an external device can include a camera. Connector 615 can include terminals (e.g., nodes) that can correspond to nodes 211 through 216 (FIG. 4 or FIG. 8) or nodes 1211 through 1213 (FIG. 12) to receive signals from a camera.

As shown in FIG. 6, processor 610 can include a FIVR 612, which can include a synchronizer 655. FIVR 612 can include one of FIVRs 110, 111, 112, and 113 of FIG. 1 or FIVR 210 of FIG. 2. Synchronizer 655 can include synchronizer 255 of FIG. 2, synchronizer 355 of FIG. 3, or synchronizer 455 of FIG. 4. Thus, FIVR 612 and synchronizer 655 can include elements and operations of any of the FIVRs (e.g., 110, 111, 112, 113, and 210) and synchronizers (e.g., 255, 255, and 455), respectively, described above with reference to FIG. 1 through FIG. 5.

FIG. 6 shows an example where only processor 610 includes FIVR 612 and synchronizer 655. However, one or more of memory device 620, memory controller 530, graphics controller 640, and I/O controller 650 can also include FIVR 612 and synchronizer 655.

FIG. 6 shows the elements (e.g., devices and controllers) of system 600 arranged separately from each other as an example. For example, each of processor 610, memory device 620, memory controller 630, graphics controller 640, and I/O controller 650 can be located on a separate IC chip (e.g., separate semiconductor dies). In some arrangements, two or more elements (e.g., processor 610, memory device 620, graphics controller 640, and I/O controller 650) of system 600 can be located on the same die (e.g., same IC chip) that can form a system-on-chip. The illustrations of the apparatuses (e.g., apparatus 100, FIVR 210, PWM 350, and synchronizer 455, and system 600) and methods (e.g., method 700 and operations of apparatus 100, FIVR 210, PWM 350, and synchronizer 455, and system 600) described above are intended to provide a general understanding of the structure of different embodiments and are not intended to provide a complete description of all the elements and features of an apparatus that might make use of the structures described herein.

The illustrations of the apparatuses (e.g., apparatus 100, FIVR 210, PWM 350, and synchronizer 455, and system 600) and methods (e.g., method 500 and operations of apparatus 100, FIVR 210, PWM 350, and synchronizer 455, and system 600) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 4) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including a phase frequency detector to generate output information having a value based on a relationship between a first clock signal and a second clock signal, a memory element to store the values of the output information, a digital control oscillator to generate the second clock signal having a phase and frequency based on a digital code, the digital code having a value based on control information, and circuitry to generate the control information based on conditions determined at least from the values stored in the memory element.

In Example 2, the subject matter of Example 1 may optionally include, wherein the circuitry is to generate correction information based on a current value of the output information and a previous value of the output information, and the circuitry is to adjust a value of the digital code based on the correction information.

In Example 3, the subject matter of Example 1 or 2 may optionally include, wherein the circuitry is to increase a value of the correction information based on a condition determined from the current value of the output information and at least one of previous values of the output information.

In Example 4, the subject matter of Example 1 or 2 may optionally include, wherein the circuitry is to increase a value of the correction information if the current value of the output information and at least one of previous values of the output information have a same value.

In Example 5, the subject matter of Example 1 or 2 may optionally include, wherein the circuitry is to decrease a value of the correction information based on a condition determined from the current value of the output information and at least one of previous values of the output information.

In Example 6, the subject matter of Example 1 or 2 may optionally include, wherein the circuitry is to decrease a value of the correction information if the current value of the output information and at least one of previous values of the output information have different values.

In Example 7, the subject matter of Example 1 may optionally include, wherein the circuitry is to compute values for proportional control rate information and integral control rate information before decoding the values to generate values for calculating the value of the digital code.

In Example 8, the subject matter of Example 2 may optionally include, wherein the output information includes a single bit.

In Example 9, the subject matter of Example 8 may optionally include, wherein the correction information includes multiple bits.

Example 10 includes subject matter (such as a device, an electronic apparatus (e.g., circuit, electronic system, or both), or a machine) including a pulse-width modulator (PWM) included in a voltage controller to generate a PWM signal, and a synchronizer included in the voltage controller to generate an output clock signal and provide the output clock signal to the pulse-width modulator as part of generation of the PWM signal, the synchronizer including a phase frequency detector to generate output information based on a relationship between a first clock signal and a second clock signal, a digital controlled oscillator to generate the second clock signal, circuitry to generate a digital code based on correction information to control the phase and frequency of the second clock signal, the correction information being generated based on a condition determined from at least a first value and second value of the output information, the first value being generated based on a first relationship between the first and second clock signals, the second value being generated based on a second relationship between the first and second clock signals.

In Example 11, the subject matter of Example 10 may optionally include, wherein the correction information being generated based on a condition determined from a third value of the output information, the third value being generated based on a third relationship between the first and second clock signals.

In Example 12, the subject matter of Example 10 may optionally include, wherein the correction information being generated based on condition determined from a fourth value of the output information, the fourth value being generated based on a fourth relationship between the first and second clock signals.

In Example 13, the subject matter of Example 10 may optionally include, wherein the first relationship between the first and second clock signals is based on timing of an edge of the first clock signal and an edge of the second clock signal.

In Example 14, the subject matter of Example 10 may optionally include, wherein the circuitry includes a controller to store the first value and second value of the output information.

In Example 15, the subject matter of Example 10 may optionally include, wherein the circuitry includes a log-rate counter to provide the correction information.

In Example 16, the subject matter of Example 10 may optionally include, wherein the circuitry is to compute values for proportional control rate information and integral control rate information, and the digital code is generated based on the proportional control rate information and integral control rate information.

In Example 17, the subject matter of Example 10 may optionally include, wherein the pulse-width modulator includes a generator to receive the second clock signal from the digital controlled oscillator and generate a triangular wave signal, and the PWM signal is generated based on the triangular wave signal.

Example 18 includes subject matter (such as a device, an electronic apparatus (e.g., circuit, electronic system, or both), or a machine) including an antenna, and an integrated circuit device coupled to the antenna, the integrated circuit device including a voltage regulator, the voltage regulator including a pulse-width modulator, the pulse-width modulator including a frequency synchronizer, the frequency synchronizer including a phase frequency detector to generate output information at an output of the phase frequency detector, the output information having a value based on a relationship between a first clock signal and a second clock signal, a memory element to store the values of the output information, a digital control oscillator to generate the second clock signal having a phase and frequency based on a digital code, the digital code having a value based on control information, and circuitry to generate the control information based on conditions determined at least from the values stored in the memory element.

In Example 19, the subject matter of Example 18 may optionally include, wherein the integrated circuit device includes a processor.

In Example 20, the subject matter of Example 18 or 19 may optionally include, further comprising a connector coupled to at least one of the conductive lines and the device, the connector conforming with at least one of Universal Serial Bus (USB), DisplayPort (DP), High-Definition Multimedia Interface (HDMI), Thunderbolt, Ethernet, and Peripheral Component Interconnect Express (PCIe) specifications The subject matter of Example 1 through Example 20 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:
1. An apparatus comprising:
a phase frequency detector to generate output information having a value based on a relationship between a first clock signal and a second clock signal;
a memory element to store the values of the output information;
a digital control oscillator to generate the second clock signal having a phase and frequency based on a digital code, the digital code having a value based on control information; and
circuitry to generate the control information based on conditions determined at least from the values stored in the memory element, wherein the circuitry is to generate correction information based on a current value of the output information and a previous value of the output information, the circuitry is to adjust a value of the digital code based on the correction information, and the circuitry is to increase a value of the correction information based on a condition determined from the current value of the output information and at least one of previous values of the output information.

2. An apparatus comprising:
a phase frequency detector to generate output information having a value based on a relationship between a first clock signal and a second clock signal;
a memory element to store the values of the output information;
a digital control oscillator to generate the second clock signal having a phase and frequency based on a digital code, the digital code having a value based on control information; and
circuitry to generate the control information based on conditions determined at least from the values stored in the memory element, wherein the circuitry is to generate correction information based on a current value of the output information and a previous value of the output information, the circuitry is to adjust a value of the digital code based on the correction information, and the circuitry is to increase a value of the correction information if the current value of the output information and at least one of previous values of the output information have a same value.

3. An apparatus comprising:
a phase frequency detector to generate output information having a value based on a relationship between a first clock signal and a second clock signal;
a memory element to store the values of the output information;

a digital control oscillator to generate the second clock signal having a phase and frequency based on a digital code, the digital code having a value based on control information; and circuitry to generate the control information based on conditions determined at least from the values stored in the memory element, wherein the circuitry is to generate correction information based on a current value of the output information and a previous value of the output information, the circuitry is to adjust a value of the digital code based on the correction information, and the circuitry is to decrease a value of the correction information based on a condition determined from the current value of the output information and at least one of previous values of the output information.

4. An apparatus comprising:

a phase frequency detector to generate output information having a value based on a relationship between a first clock signal and a second clock signal;

a memory element to store the values of the output information;

a digital control oscillator to generate the second clock signal having a phase and frequency based on a digital code, the digital code having a value based on control information; and circuitry to generate the control information based on conditions determined at least from the values stored in the memory element, wherein the circuitry is to generate correction information based on a current value of the output information and a previous value of the output information, the circuitry is to adjust a value of the digital code based on the correction information, and, wherein the circuitry is to decrease a value of the correction information if the current value of the output information and at least one of previous values of the output information have different values.

5. An apparatus comprising:

a phase frequency detector to generate output information having a value based on a relationship between a first clock signal and a second clock signal;

a memory element to store the values of the output information;

a digital control oscillator to generate the second clock signal having a phase and frequency based on a digital code, the digital code having a value based on control information; and circuitry to generate the control information based on conditions determined at least from the values stored in the memory element, wherein the circuitry is to compute values for proportional control rate information and integral control rate information before decoding the values to generate additional values for calculating the value of the digital code.

6. The apparatus of claim 5, wherein the circuitry is to generate correction information based on a current value of the output information and a previous value of the output information, and the circuitry is to adjust a value of the digital code based on the correction information.

7. The apparatus of claim 5, wherein the output information includes a single bit.

8. The apparatus of claim 7, wherein the correction information includes multiple bits.

9. An apparatus comprising:

a pulse-width modulator (PWM) included in a voltage controller to generate a PWM signal; and a synchronizer included in the voltage controller to generate an output clock signal and provide the output clock signal to the pulse-width modulator as part of generation of the PWM signal, the synchronizer including:

a phase frequency detector to generate output information based on a relationship between a first clock signal and a second clock signal;

a digital controlled oscillator to generate the second clock signal;

circuitry to generate a digital code based on correction information to control the phase and frequency of the second clock signal, the correction information being generated based on a condition determined from at least a first value and second value of the output information, the first value being generated based on a first relationship between the first and second clock signals, the second value being generated based on a second relationship between the first and second clock signals.

10. The apparatus of claim 9, wherein the correction information is generated based on a condition determined from a third value of the output information, the third value being generated based on a third relationship between the first and second clock signals.

11. The apparatus of claim 9, wherein the correction information is generated based on a condition determined from a fourth value of the output information, the fourth value being generated based on a fourth relationship between the first and second clock signals.

12. The apparatus of claim 9, wherein the first relationship between the first and second clock signals is based on timing of an edge of the first clock signal and an edge of the second clock signal.

13. The apparatus of claim 9, wherein the circuitry includes a controller to store the first value and second value of the output information.

14. The apparatus of claim 9, wherein the circuitry includes a log-rate counter to provide the correction information.

15. The apparatus of claim 9, wherein the circuitry is to compute values for proportional control rate information and integral control rate information, and the digital code is generated based on the proportional control rate information and integral control rate information.

16. The apparatus of claim 9, wherein the pulse-width modulator includes a generator to receive the second clock signal from the digital controlled oscillator and generate a triangular wave signal, and the PWM signal is generated based on the triangular wave signal.

17. An apparatus comprising:

an antenna; and an integrated circuit device coupled to the antenna, the integrated circuit device including a voltage regulator, the voltage regulator including a pulse-width modulator, the pulse-width modulator including a frequency synchronizer, the frequency synchronizer including:

a phase frequency detector to generate output information at an output of the phase frequency detector, the output information having a value based on a relationship between a first clock signal and a second clock signal;

a memory element to store the values of the output information;

a digital control oscillator to generate the second clock signal having a phase and frequency based on a digital code, the digital code having a value based on control information; and circuitry to generate the control information based on conditions determined at least from the values stored in the memory element.

18. The apparatus of claim 17, wherein the integrated circuit device includes a processor.

19. The apparatus of claim 17, further comprising a connector coupled to the integrated circuit device, the connector conforming with at least one of Universal Serial Bus (USB), DisplayPort (DP), High-Definition Multimedia Interface (HDMI), Thunderbolt, Ethernet, and Peripheral Component Interconnect Express (PCIe) specifications.

\* \* \* \* \*